(12) United States Patent
Cheng

(10) Patent No.: US 12,720,837 B2
(45) Date of Patent: Aug. 25, 2026

(54) INTEGRATED CIRCUIT DEVICE AND MANUFACTURING METHOD THEREOF

(71) Applicant: TAIWAN SEMICONDUCTOR MANUFACTURING COMPANY, LTD., Hsinchu (TW)

(72) Inventor: Yung-Shih Cheng, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 396 days.

(21) Appl. No.: 18/468,922

(22) Filed: Sep. 18, 2023

(65) Prior Publication Data

US 2025/0098255 A1 Mar. 20, 2025

(51) Int. Cl.

| | |
|---|---|
| ***H01L 29/66*** | (2006.01) |
| ***H01L 21/8234*** | (2006.01) |
| ***H01L 27/088*** | (2006.01) |
| ***H01L 29/06*** | (2006.01) |
| ***H01L 29/423*** | (2006.01) |
| ***H01L 29/775*** | (2006.01) |
| ***H01L 29/786*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |

(Continued)

(52) U.S. Cl.
CPC ......... *H10D 64/017* (2025.01); *H10D 30/014* (2025.01); *H10D 30/43* (2025.01); *H10D 30/6735* (2025.01); *H10D 30/6757* (2025.01); *H10D 62/121* (2025.01); *H10D 84/0149* (2025.01); *H10D 84/038* (2025.01); *H10D 84/83* (2025.01)

(58) Field of Classification Search
CPC .... H10D 64/017; H10D 30/014; H10D 30/43; H10D 30/6735; H10D 30/6757; H10D 62/121; H10D 84/0149; H10D 84/038; H10D 84/83; H10D 84/832; H10D 62/151; H10D 64/254; H10D 64/256; H01L 21/76897; H01L 23/481; H01L 23/5286
USPC .......................................................... 257/368
See application file for complete search history.

(56) References Cited

U.S. PATENT DOCUMENTS

2009/0152602 A1* 6/2009 Akiyama .............. H01L 23/481 257/E21.597
2023/0015572 A1* 1/2023 Khaderbad ....... H01L 21/76825

* cited by examiner

*Primary Examiner* — Tong-Ho Kim
(74) *Attorney, Agent, or Firm* — Birch, Stewart, Kolasch & Birch, LLP

(57) ABSTRACT

An integrated circuit device includes a transistor, a dielectric layer, a first vertical connecting structure. The transistor includes a gate structure. The dielectric layer surrounds the transistor. The first vertical connecting structure extends through the dielectric layer. The gate contact via is over the gate structure. The front-side metallization pattern is over the transistor. The front-side metallization pattern includes a first conductive path and a dummy conductive pattern. The first conductive path connects the gate contact via to a top end of the first vertical connecting structure. The dummy conductive pattern is connected to the first conductive path. The back-side metallization layer is below the transistor, wherein the back-side metallization layer is connected with a bottom end of the first vertical connecting structure.

20 Claims, 17 Drawing Sheets

(51) Int. Cl.

| | |
|---|---|
| ***H10D 84/03*** | (2025.01) |
| ***H10D 84/83*** | (2025.01) |

INTEGRATED CIRCUIT DEVICE AND MANUFACTURING METHOD THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
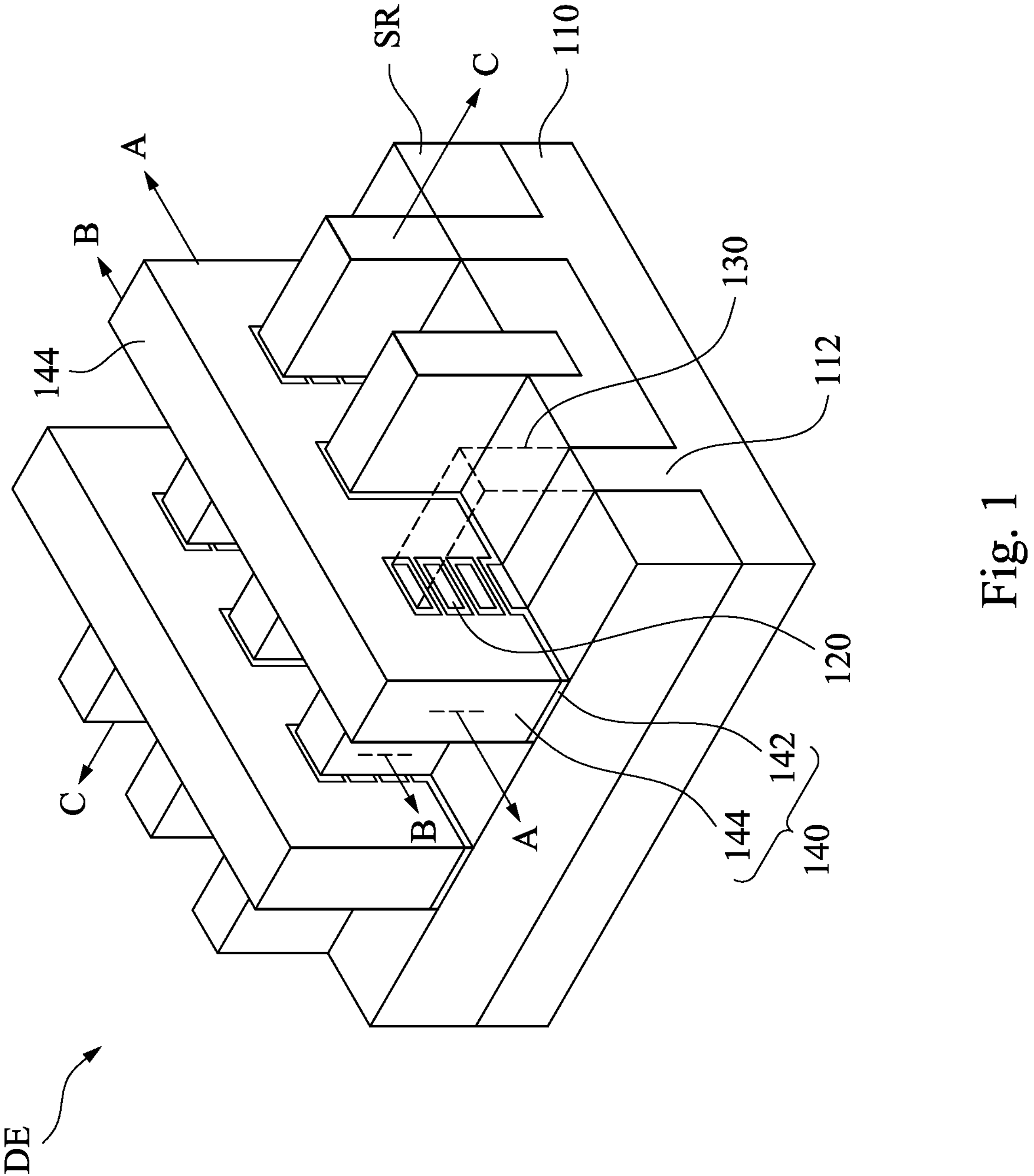
FIG. 1 illustrates an example of a transistor in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

FIG. 1 illustrates an example of a transistor DE in a three-dimensional view, in accordance with some embodiments. The transistor DE may be referred to as a nanostructure field-effect transistor (nano-FET), nanowire FETs, nanosheet FETs, or the like. The transistor DE may include nanostructures 120 (e.g., nanosheets, nanowire, or the like) over fins 112 on the substrate 110 (e.g., a semiconductor substrate), wherein the nanostructures 120 act as channel regions for the transistor DE. The nanostructure 120 may include p-type nanostructures, n-type nanostructures, or a combination thereof. Isolation regions SR are disposed between adjacent fins 112, which may protrude above and from between neighboring isolation regions SR. Although the isolation regions SR are described/illustrated as being separate from the substrate 110, as used herein, the term "substrate" may refer to the semiconductor substrate alone or a combination of the semiconductor substrate and the isolation regions. Additionally, although a bottom portion of the fins 112 are illustrated as being single, continuous materials with the substrate 110, the bottom portion of the fins 112 and/or the substrate 110 may include a single material or a plurality of materials. In this context, the fins 112 refer to the portion extending between the neighboring isolation regions SR.

Gate dielectric layers 142 are over top surfaces of the fins 112 and along top surfaces, sidewalls, and bottom surfaces of the nanostructures 120. Gate electrodes 144 are formed over the gate dielectric layers 100. Epitaxial source/drain structures 130 are disposed on the fins 112 on opposing sides of the gate dielectric layers 142 and the gate electrodes 144. The gate dielectric layers 142 and the gate electrodes 144 (also referred to as gate structures 140) contribute a gate region of the transistor, the epitaxial source/drain structures 130 contribute source/drain regions of the transistor, and the nanostructures 120 contribute a channel region of the transistor. Some embodiments discussed herein are discussed in the context of nano-FETs formed using a gate-last process. In other embodiments, a gate-first process may be used.

Also, some embodiments contemplate aspects used in planar devices, such as planar FETs or in fin field-effect transistors (FinFETs).

FIGS. 2A-11 illustrate an integrated circuit device at various intermediate stages in the manufacturing process of an integrated circuit device in accordance with some embodiments. It is understood that additional steps may be provided before, during, and after the steps shown in FIGS. 2A-11, and some of the steps described below can be replaced or eliminated for additional embodiments of the method. The order of the operations/processes may be interchangeable.

FIGS. 2A-11 includes cross-sections that are used in FIG. 1. Cross-section A-A in FIG. 1 is along a longitudinal axis of a gate electrode 102 and in a direction, for example, perpendicular to the direction of current flow between the epitaxial source/drain structures 130 of a transistor. Cross-section B-B in FIG. 1 is parallel to cross-section A-A and extends through epitaxial source/drain regions of the nano-FETs. Cross-section C-C in FIG. 1 is along a direction of current flow between the epitaxial source/drain structures 130 of a transistor. Cross-section A-A in FIG. 1 corresponds to regions A in FIGS. 2A, 3A, 4A, 7A, and 5-11. Cross-section B-B in FIG. 1 corresponds to regions B in FIGS. 2A, 3A, 4A, 7A, and 5-11. Cross-section C-C in FIG. 1 corresponds to regions C in FIGS. 2B, 3B, 4B, and 7B.

Figure 2A:
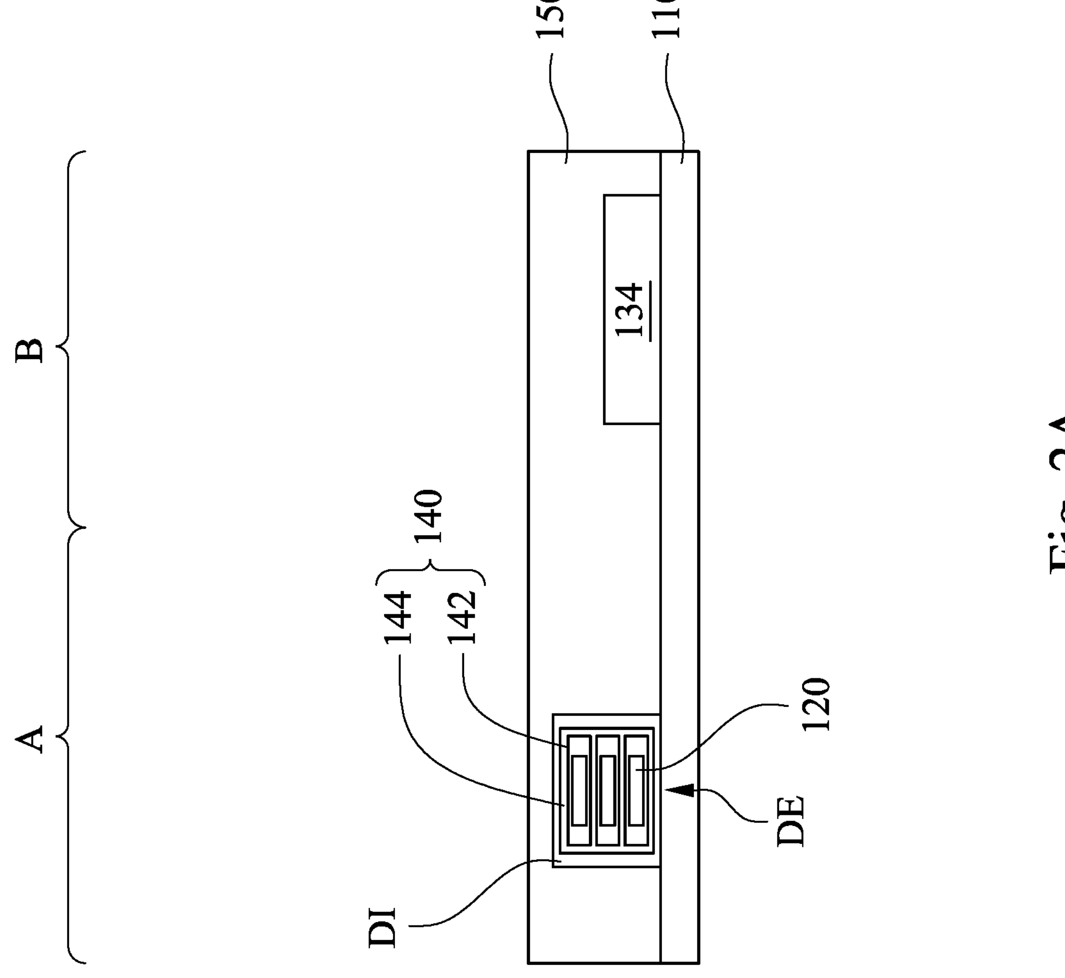
FIGS. 2A-11 illustrate cross-sectional views of an integrated circuit device at various intermediate stages in the manufacturing process of an integrated circuit device in accordance with some embodiments.
Figure 2B:
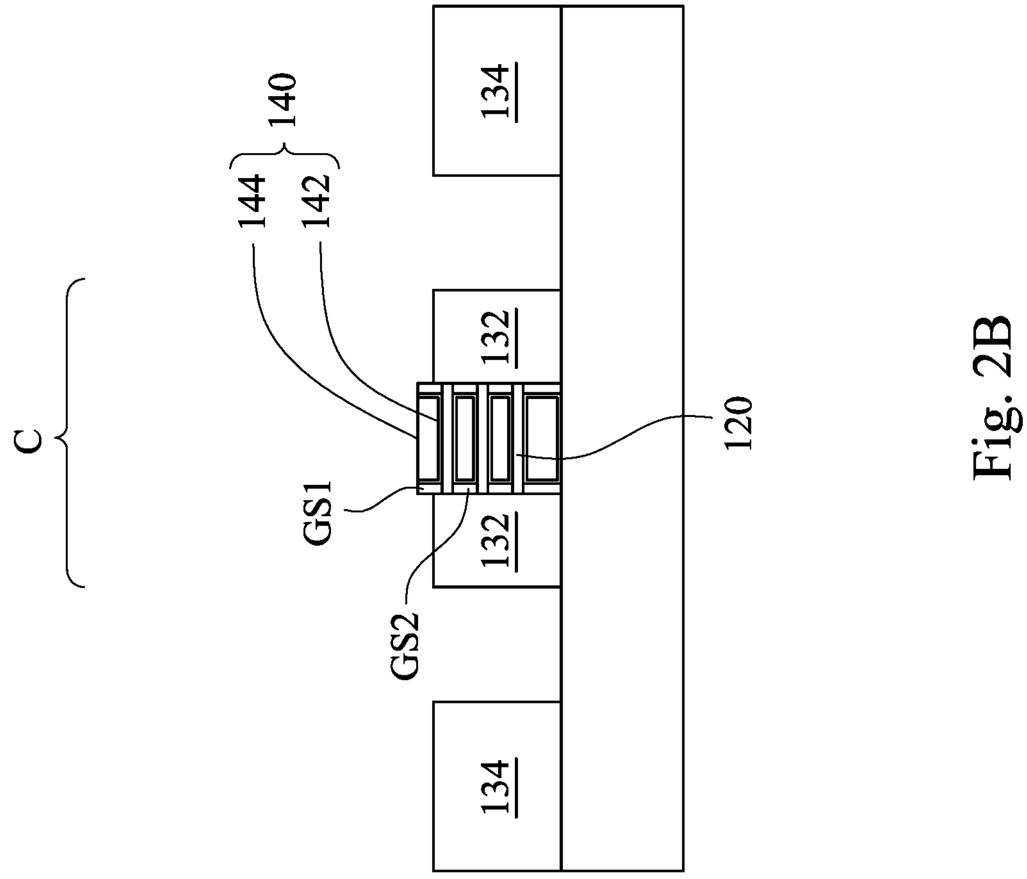

Reference is made to FIGS. 2A and 2B. The transistor DE including the nanostructures 120, the gate structures 140, and the epitaxial source/drain structures 130 is formed over the substrate 110. The gate spacers GS1 and the gate spacers GS2 may be formed one opposite sides of the isolation structure D1 for defining source/drain regions of the transistor DE and electrically isolating the epitaxial source/drain structures 130 from the gate structures 140. The isolation structure D1 may be formed around the gate structures 140 for electrical isolation. The gate spacers GS1, the gate spacers GS2, and the isolation structure D1 may include silicon nitride, silicon oxide, silicon oxynitride, the like, or the combination thereof. One or more dielectric materials 150 may be formed around the transistor DE and the source/drain epitaxial structure 134.

In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP. InP. InSb, and/or GaInAsP; or a combination thereof) or other appropriate semiconductor materials. In some embodiments, the substrate 110 may include a semiconductor-on-insulator (SOI) structure such as a buried dielectric layer between a semiconductor substrate and a semiconductor layer.

The nanostructures 120 may include suitable semiconductor material, such as group-IV semiconductor (e.g., Si, Ge, Sn, SiGe, GeSn), III-V semiconductor (e.g., GaAs), the like, or the combination thereof. In some embodiments, the nanostructures 120 is substantially dopant-free (i.e., having an extrinsic dopant concentration from about 0 $cm^{-3}$ to about $1\times10^{18}$ $cm^{-3}$), where for example, no intentional doping is performed during the epitaxial growth process. It is noted that three nanostructures 120 are vertically stacked as illustrated in FIG. 1, which is for illustrative purposes only and not intended to be limiting beyond what is specifically recited in the claims. It can be appreciated that any number of nanostructures 120 can be formed. In some embodiments, the number of the nanostructures 120 is between 1 and 8.

The epitaxial source/drain structures 130 may be formed by performing an epitaxial growth process that provides an epitaxial material on the fins 112 and the nanostructures 120. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The source/drain epitaxial structures 130 may be in-situ doped during the epitaxial process by introducing doping species including: p-type dopants, such as boron; n-type dopants, such as phosphorus or arsenic; and/or other suitable dopants including combinations thereof. If the source/drain epitaxial structures 130 are not in-situ doped, an implantation process (i.e., a junction implant process) is performed to dope the source/drain epitaxial structures 130. In some exemplary embodiments, the source/drain epitaxial structures 130 in a PFET device include SiGe doped with boron, or SiGeC doped with boron, Ge doped with boron, Si doped with boron, or combination. The p-type doping concentration of the source/drain epitaxial structures 130 (e.g., boron) in the PFET device may be in a range from about 1E19/$cm^3$ to about 6E20/$cm^3$. In some exemplary embodiments, the source/drain epitaxial structures 130 in an NFET device include SiP. SiC, SiPC, SiAs, Si, or combination thereof. The n-type doping concentration of the source/drain epitaxial structures 190 (e.g., phosphorus, arsenic, or both) in the NFET device may be in a range from about 2E19/$cm^3$ to about 3E21/$cm^3$.

In FIGS. 2A and 2B, the source/drain epitaxial structures 130 are labelled as source/drain structures 132 and 134, in which the source/drain epitaxial structure 134 may serve as a portion of a vertical path connecting a front-side metal to a back-side metal, the source/drain structure 132 may merely serve as source/drain regions of a transistor included in a functional cell, such as static random-access memory (SRAM) cell.

In accordance with some embodiments, the gate dielectric layers 142 may include one or more dielectric layers, such as an oxide, a metal oxide, the like, or combinations thereof. For example, in some embodiments, the gate dielectric layers 142 may include a silicon oxide layer and a metal oxide layer over the silicon oxide layer. In some embodiments, the gate dielectric layers 142 include a high-k dielectric material, and in these embodiments, the gate dielectric layers 142 may have a k value greater than about 7.0, and may include a metal oxide or a silicate of hafnium, aluminum, zirconium, lanthanum, manganese, barium, titanium, lead, and combinations thereof. The formation methods of the gate dielectric layers 142 may include molecular-beam deposition (MBD), ALD. PECVD, and the like.

The gate electrodes 144 are deposited over the gate dielectric layers 142, respectively. The gate electrodes 144 may include a metal-containing material such as titanium nitride, titanium oxide, tantalum nitride, tantalum carbide, cobalt, ruthenium, aluminum, tungsten, combinations thereof, or multi-layers thereof. For example, the gate electrodes 144 may include any number of liner layers, any number of work function tuning layers 144A, and a fill material 144B.

The dielectric materials 150 may include interlayer dielectric (ILD) layer, etch stop layer, the like, or the combination thereof. The ILD layer may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The etch stop layer may include a dielectric material, such as, silicon nitride, silicon oxide, silicon oxynitride, or the like, having a different etch rate than the material of the ILD layer. With the dielectric materials 150 surrounding and covering the device DE, a front-end-of-line (FEOL) structure is manufactured in FIGS. 2A and 2B.

Figure 3A:
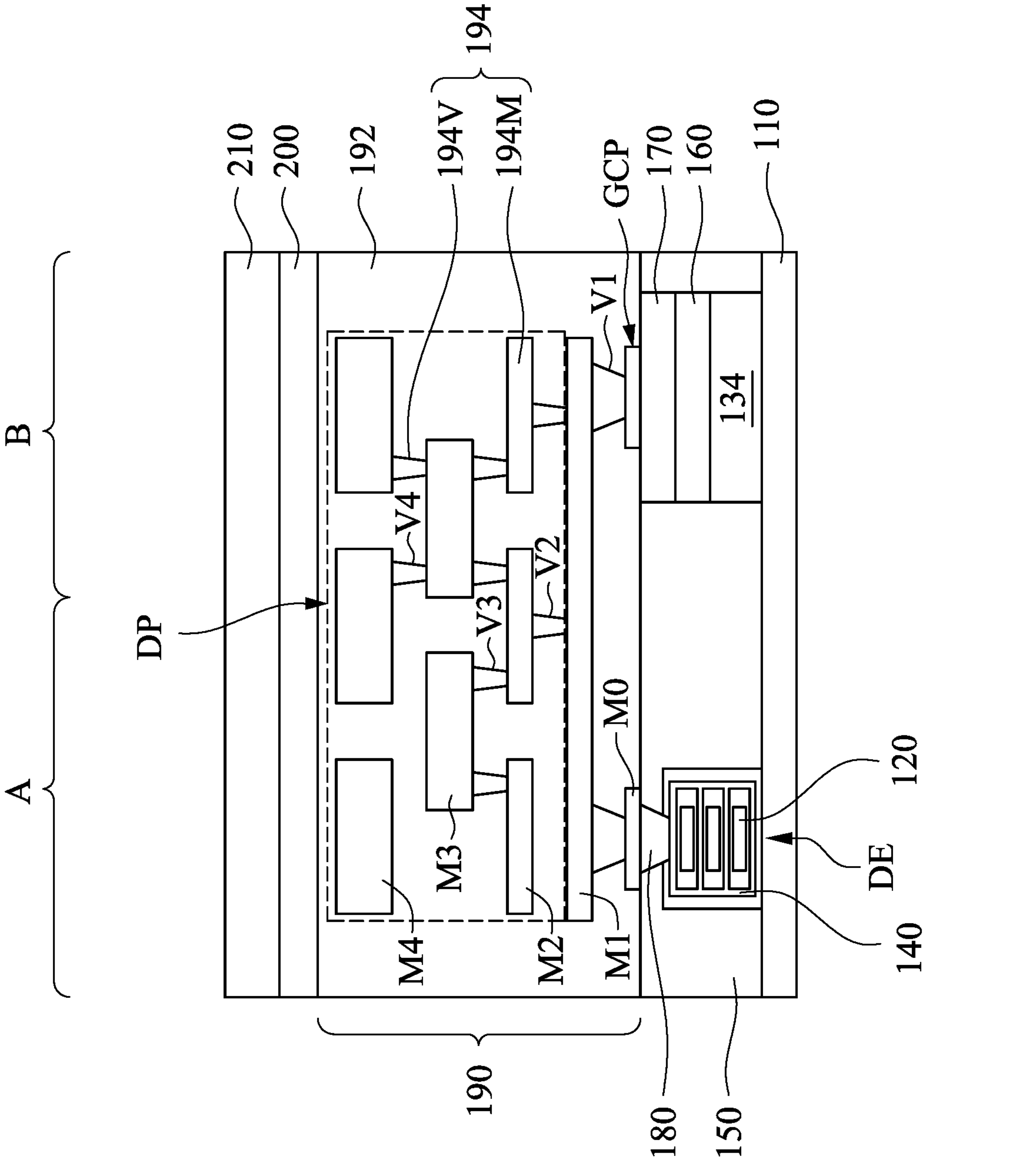
Figure 3B:
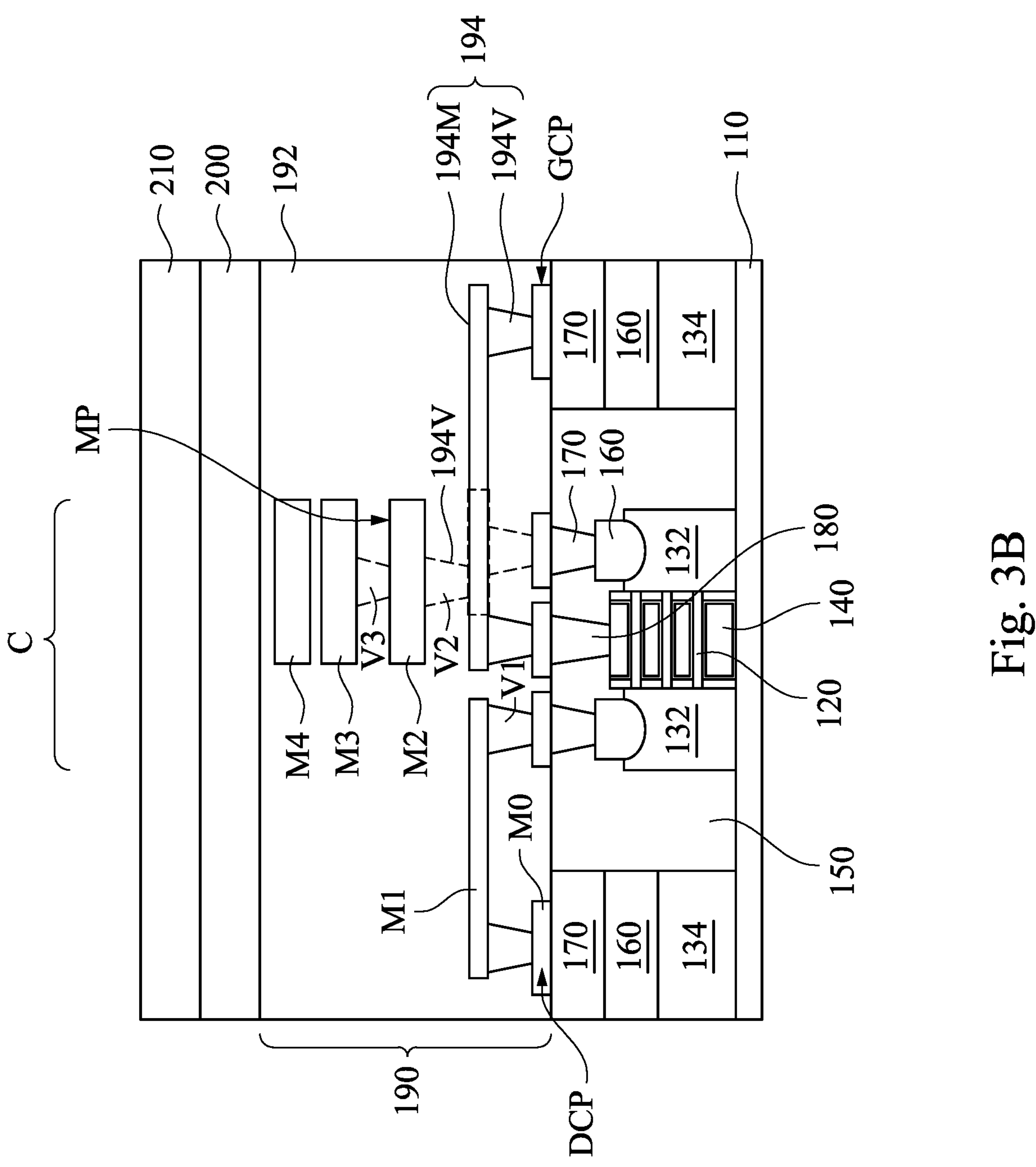

Reference is made to FIGS. 3A and 3B. Source/drain contacts 160 are formed over the source/drain epitaxial structures 132 and 134, source/drain vias 170 are formed over the source/drain contacts 160, and gate contact via 180 is formed over the high-k/metal gate structure 140. Formation of each of the source/drain contacts 160, the source/drain vias 170, and the gate contact via 180 may include etching openings in the dielectric materials (e.g., dielectric materials 150) to expose the underlying structures (e.g., the source/drain epitaxial structures 132 and 134, the source/drain contacts 160, and the high-k/metal gate structure 140, respectively), filling the openings with a suitable conductive material. The conductive material may include TiN, TaN, Ti, Ta, W, Pt, copper, the like, or the combination thereof. A planarization process (e.g., chemical mechanical polish (CMP) process) may be performed to remove an excess portion of the conductive material external to the openings, and remaining portions of the conductive material form the source/drain contacts 160, the source/drain vias 170, and the gate contact via 180. After the formation of the source/drain vias 170 and the gate contact via 180, a front-side metallization structure (FMLI) 190 is formed.

As depicted, the FMLI 190 includes a metallization pattern 194 and a dielectric structure 192 surrounding the metallization pattern 194. In the illustrated embodiments, the metallization pattern 194 includes five metallization layers 194M, labeled as M0 through M4, with four layers of metallization vias or interconnects 194V, labeled as V1 through V4. Each of the metallization layers 194M may include one or more metal lines extend horizontally in the dielectric structure 192, while the metallization via extend vertically in the dielectric structure 192. Other embodiments may contain more or fewer metallization layers and a corresponding more or fewer number of vias. The dielectric structure 192 may include one or more ILD layers, inter-metal dielectric (IMD) layers, etch stop layers, the like, or the combination thereof. The dielectric structure 192 may provide electrical insulation as well as structural support for the various features of the integrated circuit during many fabrication process steps.

In some embodiments of the present disclosure, the gate structure 140 is connected to a first source/drain epitaxial structure 134 through a conductive path GCP, formed by the metallization layers M0 and M1 and metallization vias V1 of the metallization pattern 194. The conductive path GCP extends from the gate contact via 180 to the source/drain vias 170, thereby receiving or sending signals through back-side metal routing fabricated in subsequent process. For example, the metallization layer M0 has metal line/pads in contact with the gate contact via 180 to the source/drain vias 170, and the metallization vias V1 connect the metal line/pads of the metallization layer M0 to a metal line of the metallization layer M1, thereby forming the conductive path GCP.

The metallization pattern 194 include a dummy conductive pattern DP connected to the conductive path GCP. The dummy conductive pattern DP may include metallization layers M2-M4 and metallization vias V2-V4. For example, the dummy conductive pattern DP comprises plural adjacent metal lines in metallization layers M2, plural adjacent metal lines in the metallization layer M3, and plural adjacent metal lines in metallization layers M4, in which at least metallization via V2 connects the metal lines of the metallization layers M2 to the metal line of the metallization layers M1 of the conductive path GCP, and the metallization vias V3 and V4 connects the metal lines of different metallization layers M2-M4 to each other. Through the configuration, the metal lines in the metallization layer M2, the metal lines in the metallization layer M3, and the metal lines in the metallization layer M4 are electrically coupled to the conductive path GCP. The metal lines in the dummy conductive pattern DP may be at a position higher than the metal lines in the conductive path GCP. Through configuration of the dummy conductive pattern DP, charges induced during a back-side plasma process can be relaxed, thereby avoiding channel resistance degradation.

In some embodiments, the metallization via V2 of the dummy conductive pattern DP may overlap the vertical connecting structures GTV. In some alternative embodiments, the metallization via V2 of the dummy conductive pattern DP may not overlap the vertical connecting structures GTV. In the illustrated embodiments, two metallization vias V2 of the dummy conductive pattern DP connecting the metal lines of the metallization layers M2 to the metal line of the metallization layers M1 of the conductive path GCP. Depending on device requirement, the dummy conductive pattern DP may include any suitable number of the metallization vias V2 connecting the metal lines of the metallization layers M2 to the metal line of the metallization layers M1 of the conductive path GCP. For example, the dummy conductive pattern DP may include merely one metallization vias V2 connecting the metal lines of the metallization layers M2 to the metal line of the metallization layers M1 of the conductive path GCP. Alternatively, the dummy conductive pattern DP may include more than two metallization vias V2 connecting the metal lines of the metallization layers M2 to the metal line of the metallization layers M1 of the conductive path GCP.

The metallization pattern 194 may further include other conductive paths and/or patterns separated from the dummy conductive pattern DP and the conductive path GCP. For example, in some embodiments, a drain node of the source/drain epitaxial structures 132 of the transistor DE (e.g., a drain node) is connected to a second source/drain epitaxial structure 134 through a conductive path DCP, formed by the metallization layers M0 and M1 and metallization vias V1 of the metallization pattern 194, thereby electrically connected to other devices or powers through back-side metal routing fabricated in subsequent process. In some embodiments, a source node of the source/drain epitaxial structures 132 of the transistor DE is electrically connected to other devices or powers through the front-side metal routing, for example, through a main conductive pattern MP of the metallization pattern 194. The main conductive pattern MP of the metallization pattern 194 may be formed by the metallization layers M0-M4 and metallization vias V1-V4.

The dummy conductive pattern DP and the conductive path GCP are spaced apart and/or isolated from other conductive paths and/or patterns of the metallization pattern 194 (e.g., the conductive path DCP and the main conductive pattern MP) by a portion of the dielectric structure 192. Thus, while the conductive path GCP, the conductive path DCP and the main conductive pattern MP serves for signal transmission and/or power delivery, the dummy conductive pattern DP serves as charge pool for receiving and relaxing charges and does not form a conductive path for signal transmission and/or power delivery. Stated differently, in some embodiments, the metallization pattern 194 is consisted of a first portion (i.e., the dummy conductive pattern DP), a second portion (i.e., the conductive path GCP), and a third portion (i.e., all other portions of the metallization pattern 194), in which the first portion (i.e., the dummy conductive pattern DP) is merely connected to the second portion (i.e., the conductive path GCP), and spaced apart and/or (electrically) isolated from the third portion (i.e., all the other portions of the metallization pattern 194). That is, except from connecting points (e.g., the metallization vias V2 of the dummy conductive pattern DP) between the dummy conductive pattern DP and the conductive path GCP, the dummy conductive pattern DP can be entirely wrapped by the dielectric structure 192.

After the formation of the FMLI 190, the integrated circuit device is bonded to a carrier substrate 210 by a bonding layer 200. The carrier substrate 210 may be a glass carrier substrate, a ceramic carrier substrate, a semiconductor substrate (e.g., a silicon substrate), a wafer (e.g., a silicon wafer), or the like. The carrier substrate 210 may provide structural support during subsequent processing steps and in the completed device. The carrier substrate 210 be substantially free of any active or passive devices. The bonding layer 200 may include any suitable dielectric material capable of bonding the integrated circuit device to the carrier substrate 210. After being bonded to the carrier substrate 210, the integrated circuit device may be flipped such that a backside of the integrated circuit device faces upwards, and subsequent process can be performed on the backside of the integrated circuit device.

Figure 4A:
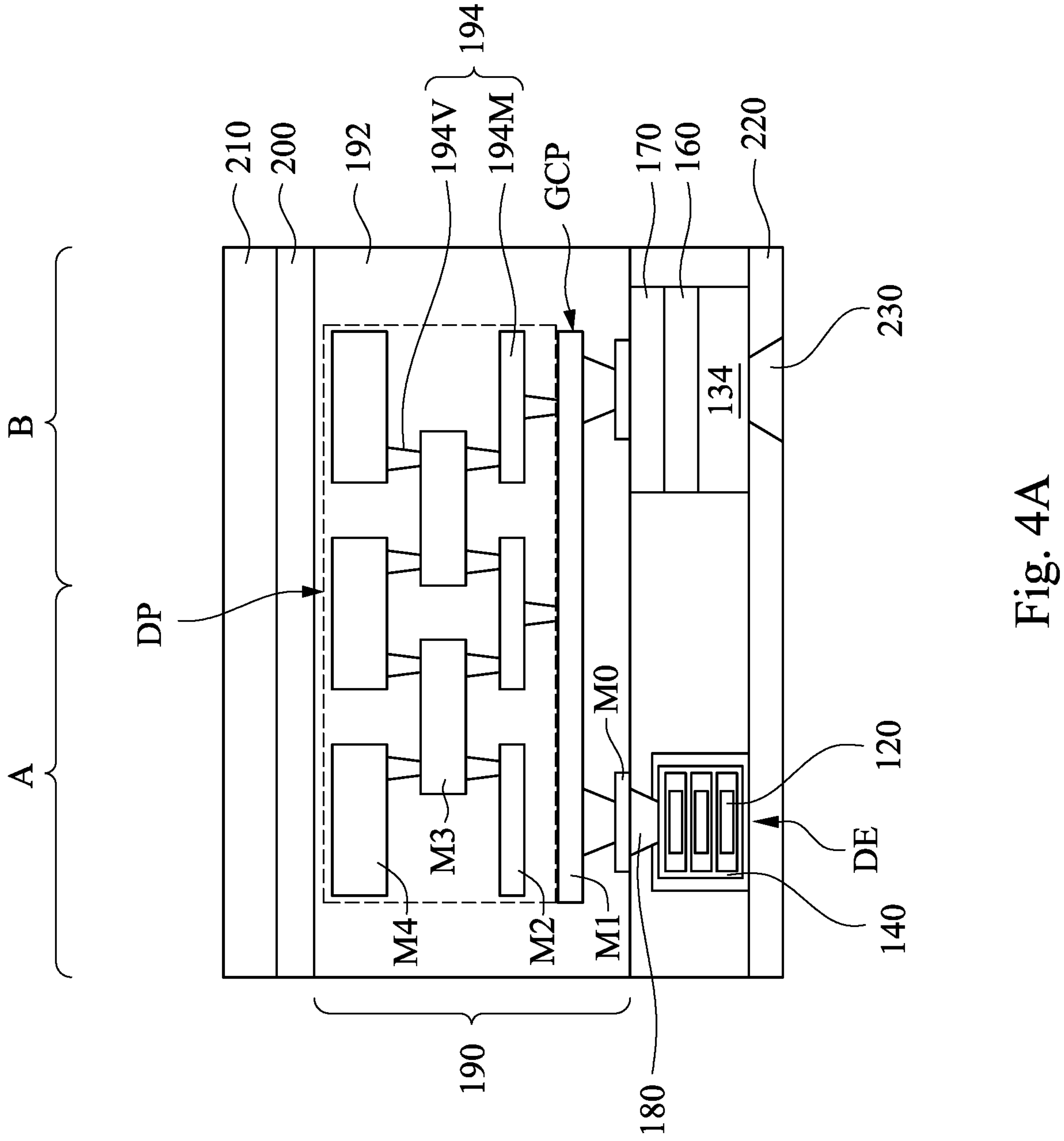
Figure 4B:
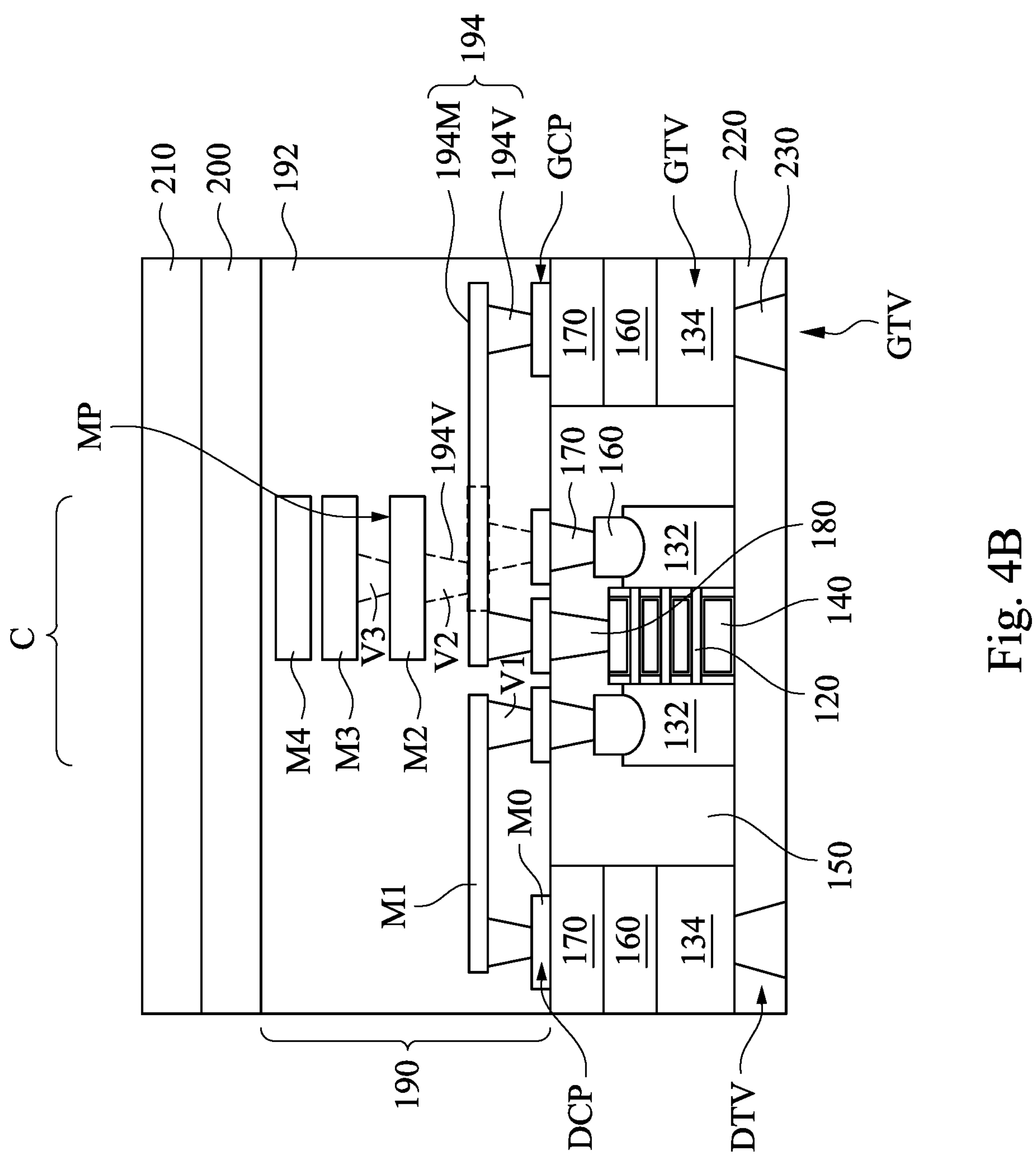

Reference is made to FIGS. 4A and 4B. The substrate 110 (referring to FIGS. 3A and 3B) is removed to expose backsides of the source/drain epitaxial structures 134, and then backside contacts 230 are formed on the backsides of the source/drain epitaxial structures 134. In some embodiments, after the removal of the substrate 110 (referring to FIGS. 3A and 3B) and prior to the formation of the backside contacts 230, an ILD layer 220 is formed on the backsides of the integrated circuit device. The ILD layer 220 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. Formation of the backside contacts 230 may include etching openings in the ILD layer 220 to expose the backsides of the source/drain epitaxial structure 134, and filling openings in the ILD layer 220 with a suitable conductive material. The conductive material may include TiN, TaN, Ti, Ta, W. Pt, copper, the like, or the combination thereof. A planarization process (e.g., chemical mechanical polish (CMP) process) may be performed to remove an excess portion of the conductive material external to the openings, and remaining portions of the conductive material form the backside contacts 230.

In some embodiments of the present embodiments, a vertical connecting structure (e.g., vertical connecting structures GTV and DTV) extending vertically in the dielectric materials surrounding the transistor DE and connecting the FMLI 190 to a back-side metallization structure (BMLI) subsequently formed. For example, the vertical connecting structure GTV enables the gate structure 140 routing to the BMLI, and the vertical connecting structure DTV enables the source/drain epitaxial structure 132 routing to the BMLI. In the present embodiments, the vertical connecting structure GTV and/or DTV includes a combination of the backside contacts 230, the source/drain epitaxial structures 134, the source/drain contact structures 160, source/drain vias 170. In some other embodiments, the vertical connecting structure GTV and/or DTV may include a different structure from the combination of the backside contacts 230, the source/drain epitaxial structures 134, the source/drain contact structures 160, source/drain vias 170. For example, the vertical connecting structures GTV and DTV may be metal through vias.

Figure 5:
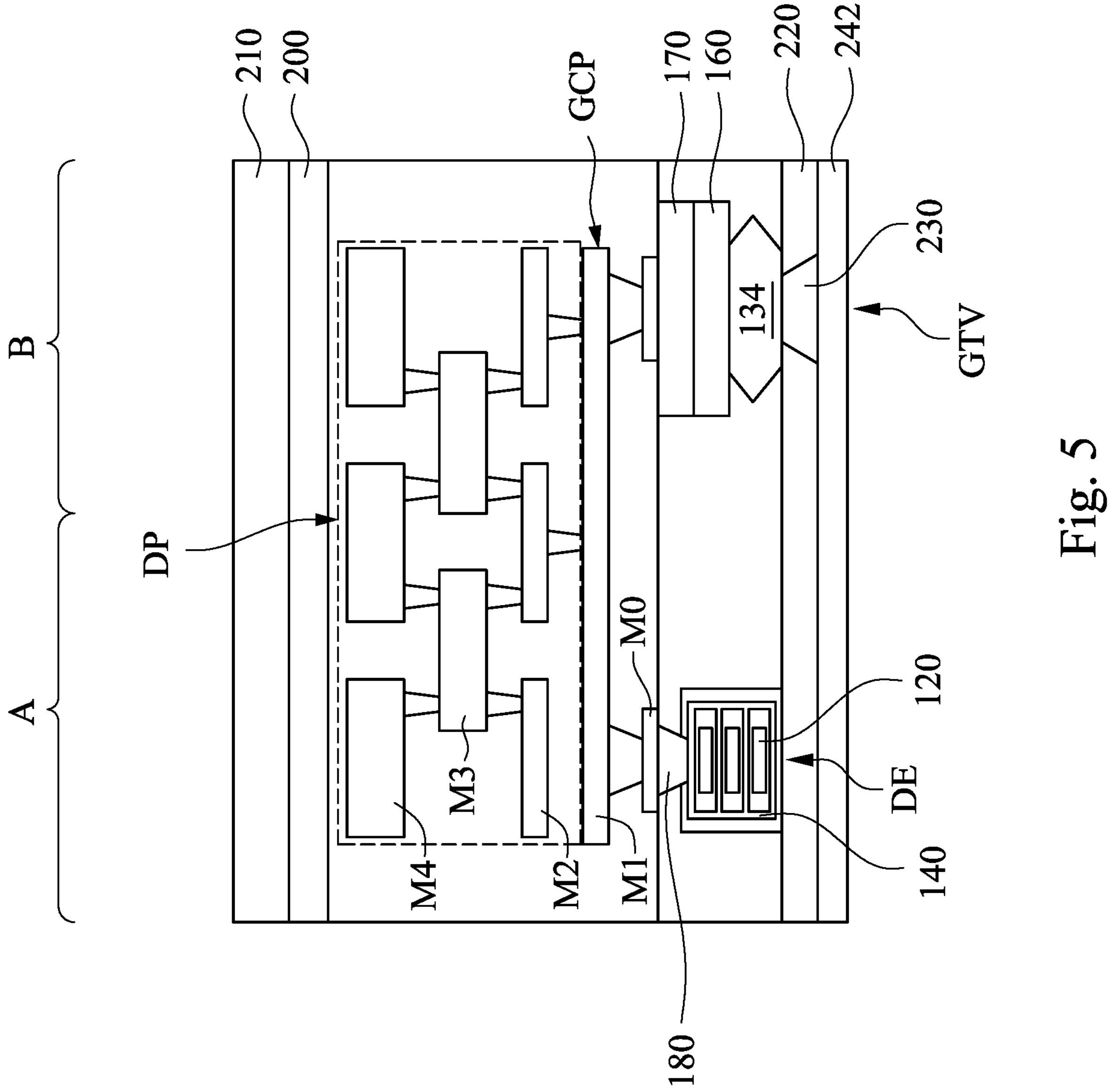

FIGS. 5-11 illustrates the formation of a BMLI 240. Reference is made to FIG. 5. An ILD layer 242 is formed over the backside contacts 230. The ILD layer 242 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Figure 6:
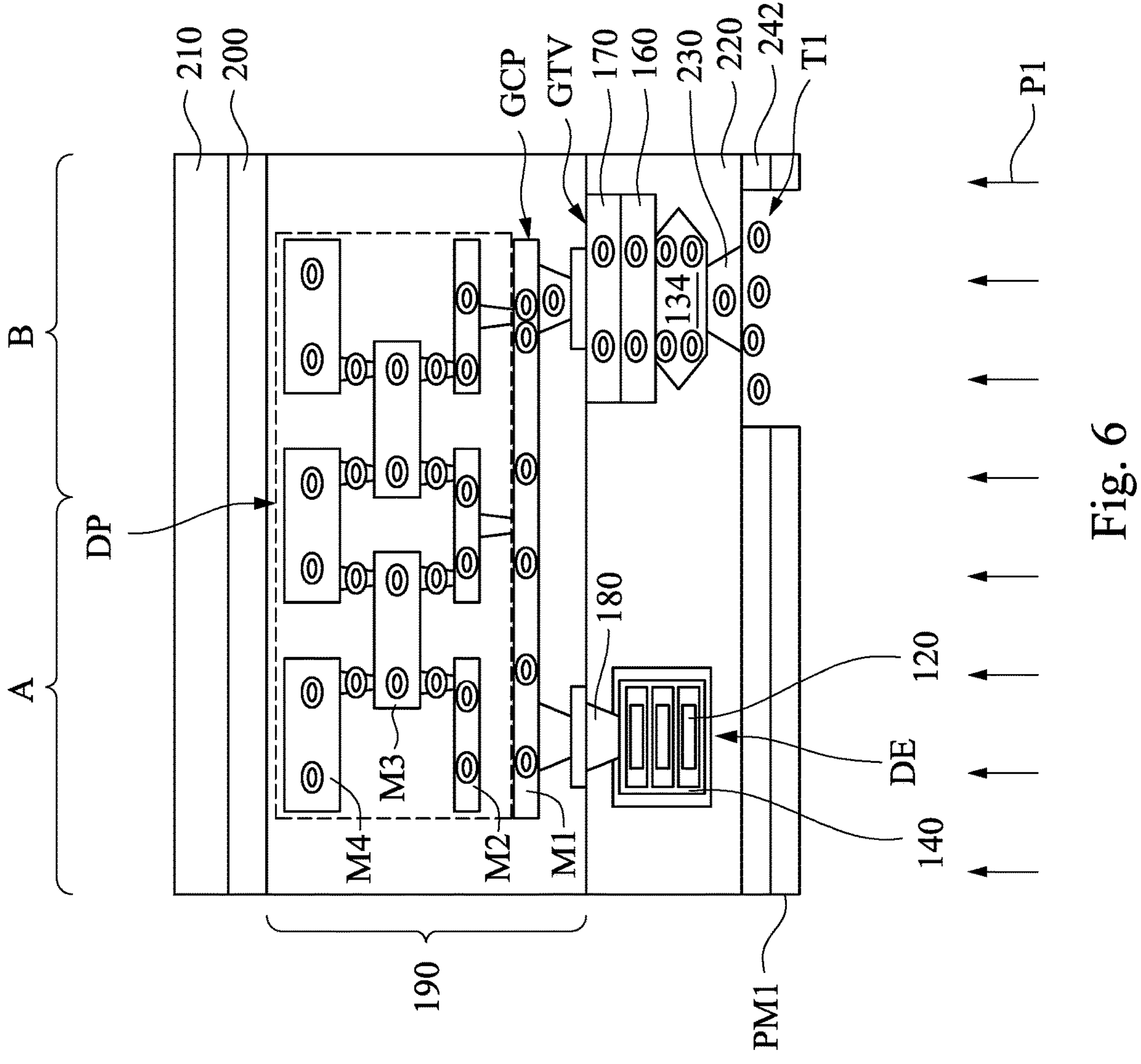

Reference is made to FIG. 6. The ILD layer 242 is patterned to expose the backside contacts 230. The patterning process may include a photolithography process and an etching process. The photolithography process may include forming a photoresist layer (not shown) over the structure of FIG. 5, exposing the photoresist to a pattern, performing post-exposure bake processes, and developing the resist, thereby forming a patterned mask PM1 including the resist. In some embodiments, a hard mask layer (not shown) may be formed over the structure of FIGS. 3A and 3B prior to the formation of the photoresist layer (not shown) and patterned by an etching process after developing the resist, thereby forming a patterned mask PM1 including a hard mask (e.g., silicon nitride). The patterned mask PM1 may include one or more trench openings T1 overlapping the backside contacts 230. After the formation of the patterned mask PM1, the ILD layer 242 is etched by a dry etching process. The dry etching process may use the patterned mask PM1 as an etch mask, thereby extending the trench opening T1 into the ILD layer 242. The dry etching process may include a plasma etching process P1 with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas (02), the like, or combinations thereof. Through the plasma etching process P1, the trench openings T1 are etched in the ILD layer 242 to expose the backside contacts 230. After the plasma etching process P1, the patterned mask PM1 can be removed by suitable stripping process, etching process, the like, or the combination thereof.

In absence of the dummy conductive pattern DP, during the plasma etching process P1, a large number of the charges from the plasma may be sent to the gate structure 140 of the transistor DE, which may cause plasma induced damage (PID) in the nanostructures 120 of the transistor DE. For example, channel resistance may degrade due to damage to Si crystals in the nanostructures 120.

In some embodiments of the present embodiments, with the presence of the dummy conductive pattern DP, the charges from the plasma etching process P1 can be relaxed. As a result, the charges from the plasma that is sent to the gate structure 140 of the transistor DE can be reduced, thereby avoiding channel resistance degradation.

Figure 7A:
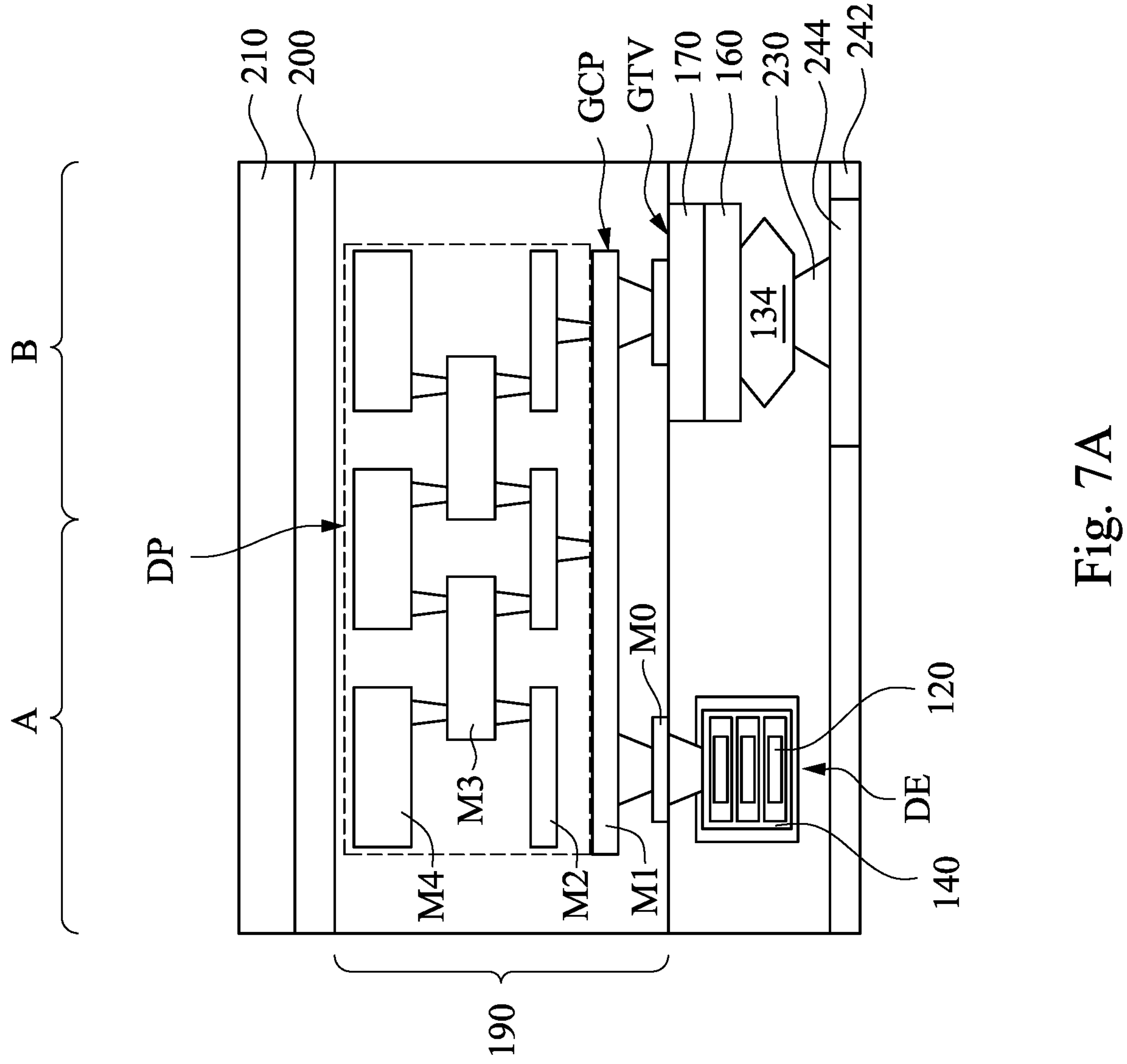
Figure 7B:
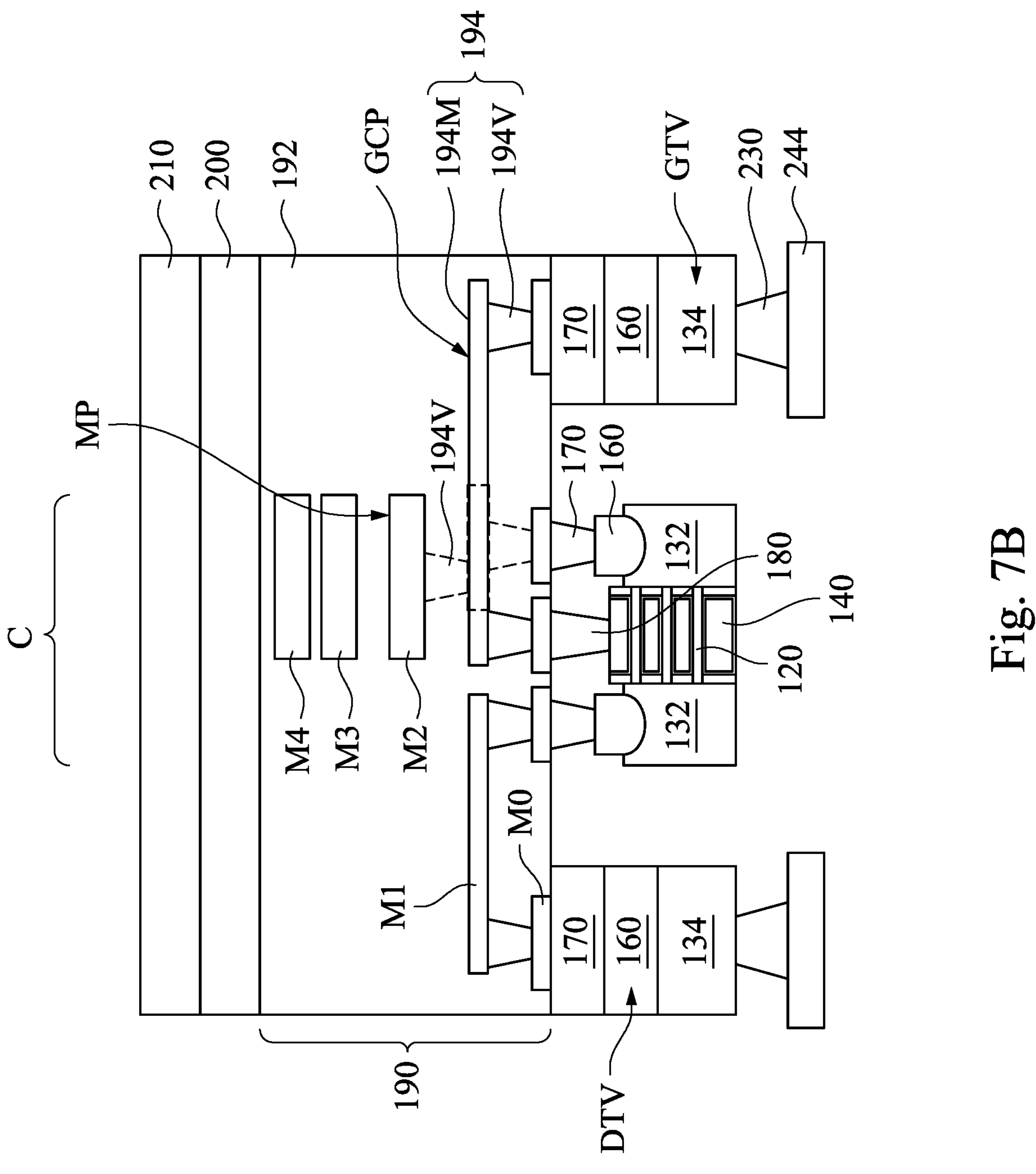

Reference is made to FIGS. 7A and 7B. A back-side metallization layer 244 is formed in the trench opening(s)

T1. Formation of the back-side metallization layer 244 may include filling trench opening(s) T1 in the ILD layer 242 with a suitable conductive material. The conductive material may include TiN, TaN. Ti, Ta, W. Pt, copper, the like, or the combination thereof. A planarization process (e.g., chemical mechanical polish (CMP) process) may be performed to remove an excess portion of the conductive material external to the trench opening(s) T1, and remaining portions of the conductive material form the back-side metallization layer 244. The back-side metallization layer 244 may include plural metal lines extend horizontally in the ILD layer 242.

Figure 8:
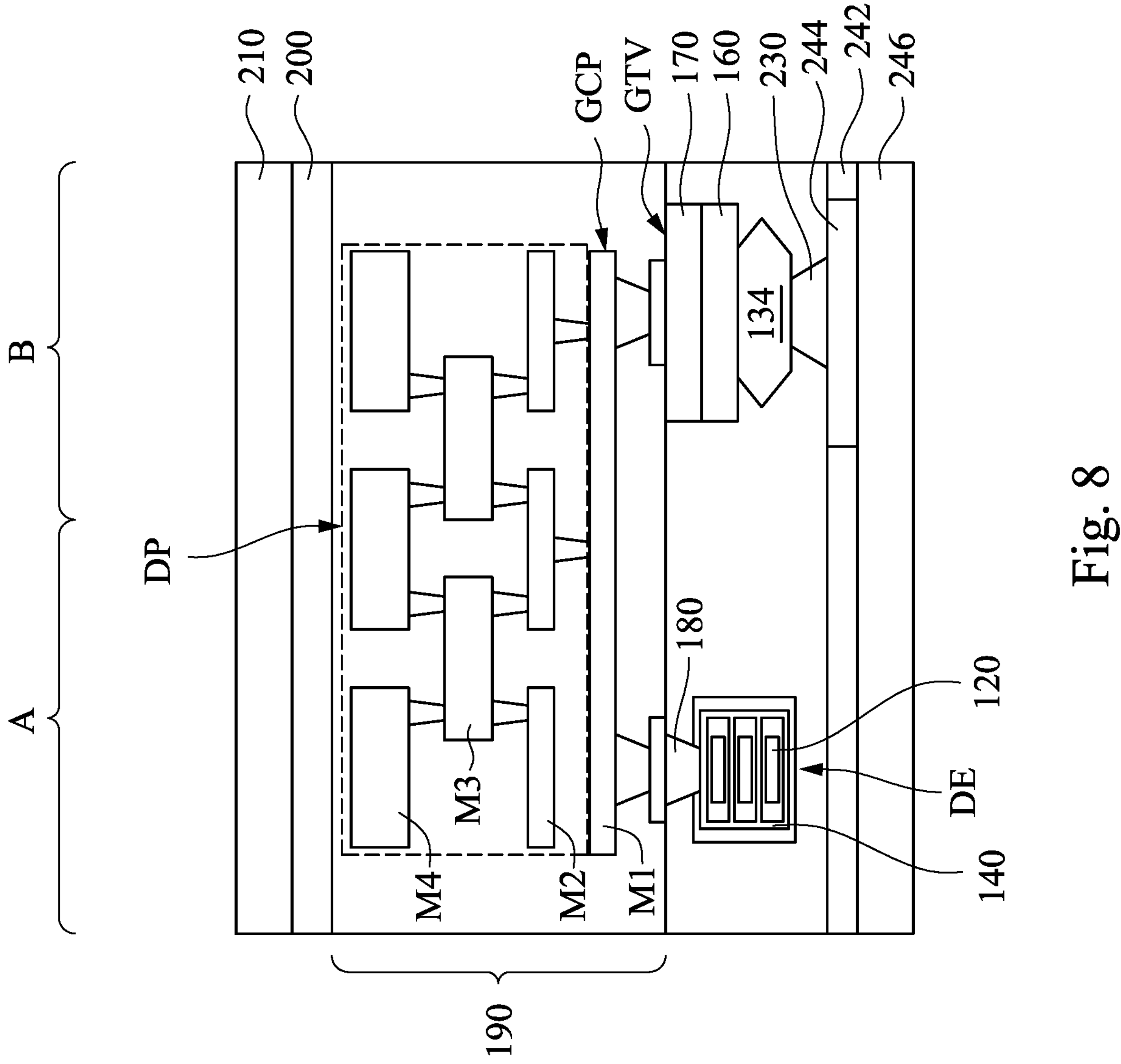

Reference is made to FIG. 8. An ILD layer 246 is formed over the back-side metallization layer 244 and the ILD layer 242. The ILD layer 246 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Figure 9:
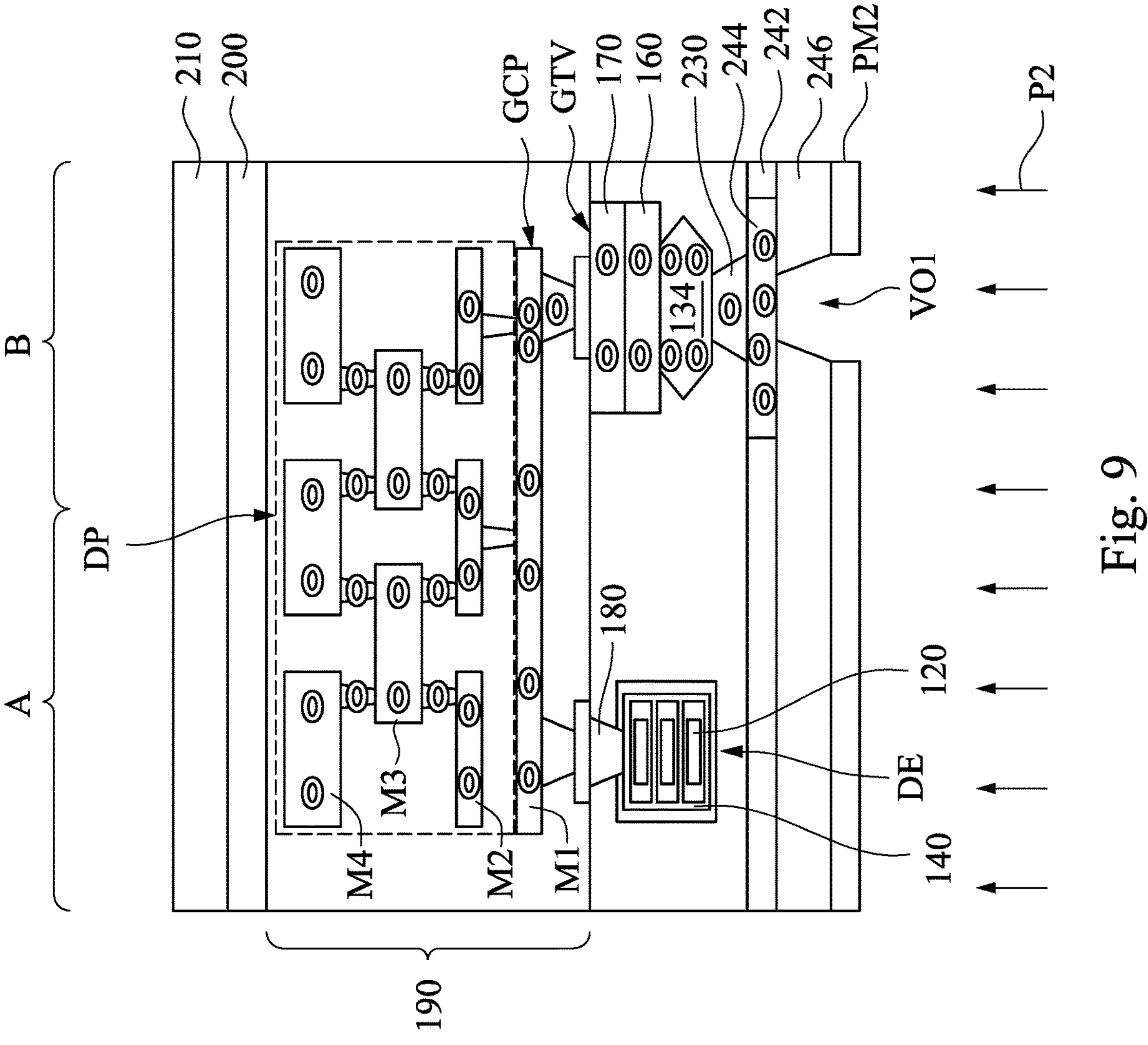
Figure 10:
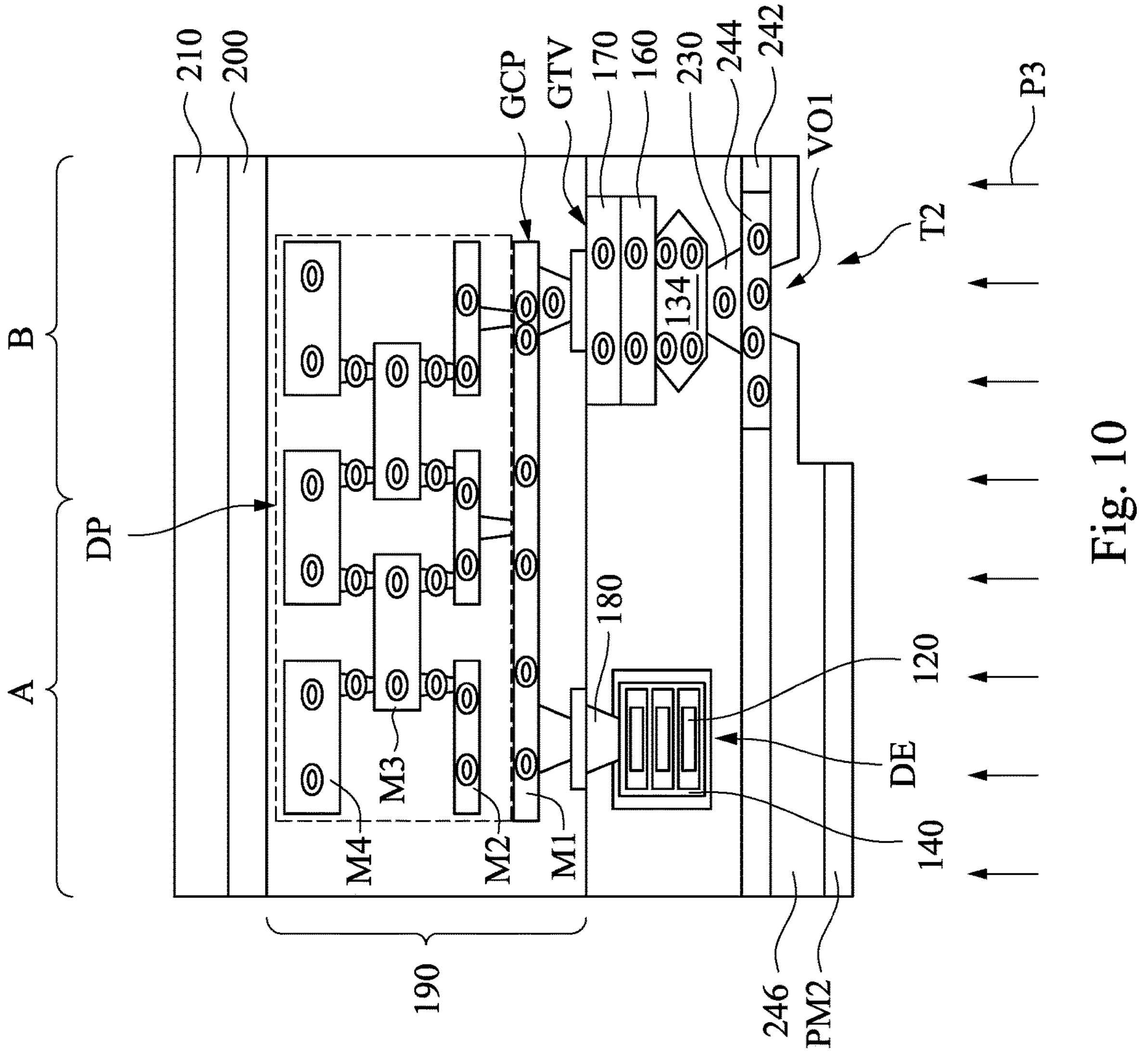

Reference is made to FIGS. 9 and 10. A trench and via etching process is performed to the ILD layer 246. The trench and via etching process may include a via etching process as illustrated in FIG. 9 and a trench etching process as illustrated in FIG. 10. In some embodiments, the trench etching process is performed after the via etching process. In some alternative embodiments, the via etching process is performed after the trench etching process.

In FIG. 9, a via opening/recess VO1 is etched in the ILD layer 246. Prior to etching the via opening/recess VO1, a patterned mask PM2 may be formed over the ILD layer 246 by suitable photolithography process. The photolithography process may include forming a photoresist layer (not shown), exposing the photoresist to a pattern, performing post-exposure bake processes, and developing the resist, thereby forming a patterned mask PM2 including the resist. In some embodiments, a hard mask layer (not shown) may be formed prior to the formation of the photoresist layer (not shown) and patterned by an etching process after developing the resist, thereby forming a patterned mask PM2 including a hard mask (e.g., silicon nitride). The patterned mask PM2 may include one or more opening/recess VO1.

After the formation of the patterned mask PM2, the ILD layer 246 is etched by a dry etching process. The dry etching process may use the patterned mask PM2 as an etch mask, thereby extending the opening/recess VO1 into the ILD layer 246. The dry etching process may include a plasma etching process P2 with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$. $CH_2F_2$. $CH_3F$. $CHF_3$, or the like), chloride-based gas (e.g., $Cl_2$), hydrogen bromide gas (HBr), oxygen gas (02), the like, or combinations thereof. Through the plasma etching process P2, the via opening/recess VO1 is etched in the ILD layer 246. The via opening/recess VO1 may expose the back-side metallization layer 244. After the plasma etching process P1, the patterned mask PM2 can be removed by suitable stripping process, etching process, the like, or the combination thereof.

In FIG. 10, a trench opening T2 is etched in the ILD layer 246. Prior to etching the trench opening T2, a patterned mask PM3 may be formed over the ILD layer 246 by suitable photolithography process. The photolithography process may include forming a photoresist layer (not shown), exposing the photoresist to a pattern, performing post-exposure bake processes, and developing the resist, thereby forming a patterned mask PM2 including the resist. In some embodiments, a hard mask layer (not shown) may be formed prior to the formation of the photoresist layer (not shown) and patterned by an etching process after developing the resist, thereby forming a patterned mask PM3 including a hard mask (e.g., silicon nitride). The patterned mask PM3 may include one or more trench opening T2.

After the formation of the patterned mask PM3, the ILD layer 246 is etched by a dry etching process. The dry etching process may use the patterned mask PM3 as an etch mask, thereby extending the trench opening T2 into the ILD layer 246. The dry etching process may include a plasma etching process P3 with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof. Through the plasma etching process P3, the trench opening T2 is etched in the ILD layer 246. A combination of the via opening/recess VO1 and the trench opening T2 may expose the back-side metallization layer 244. After the plasma etching process P3, the patterned mask PM1 can be removed by suitable stripping process, etching process, the like, or the combination thereof.

In absence of the dummy conductive pattern DP, during the plasma etching processes P2 and P3, a large number of the charges from the plasma may be sent to the gate structure 140 of the transistor DE, which may cause plasma induced damage (PID) in the nanostructures 120 of the transistor DE. For example, channel resistance may degrade due to damage to Si crystals in the nanostructures 120.

In some embodiments of the present embodiments, with the presence of the dummy conductive pattern DP, the charges from the plasma etching processes P2 and P3 can be relaxed. As a result, the charges from the plasma that is sent to the gate structure 140 of the transistor DE can be reduced, thereby avoiding channel resistance degradation.

Figure 11:
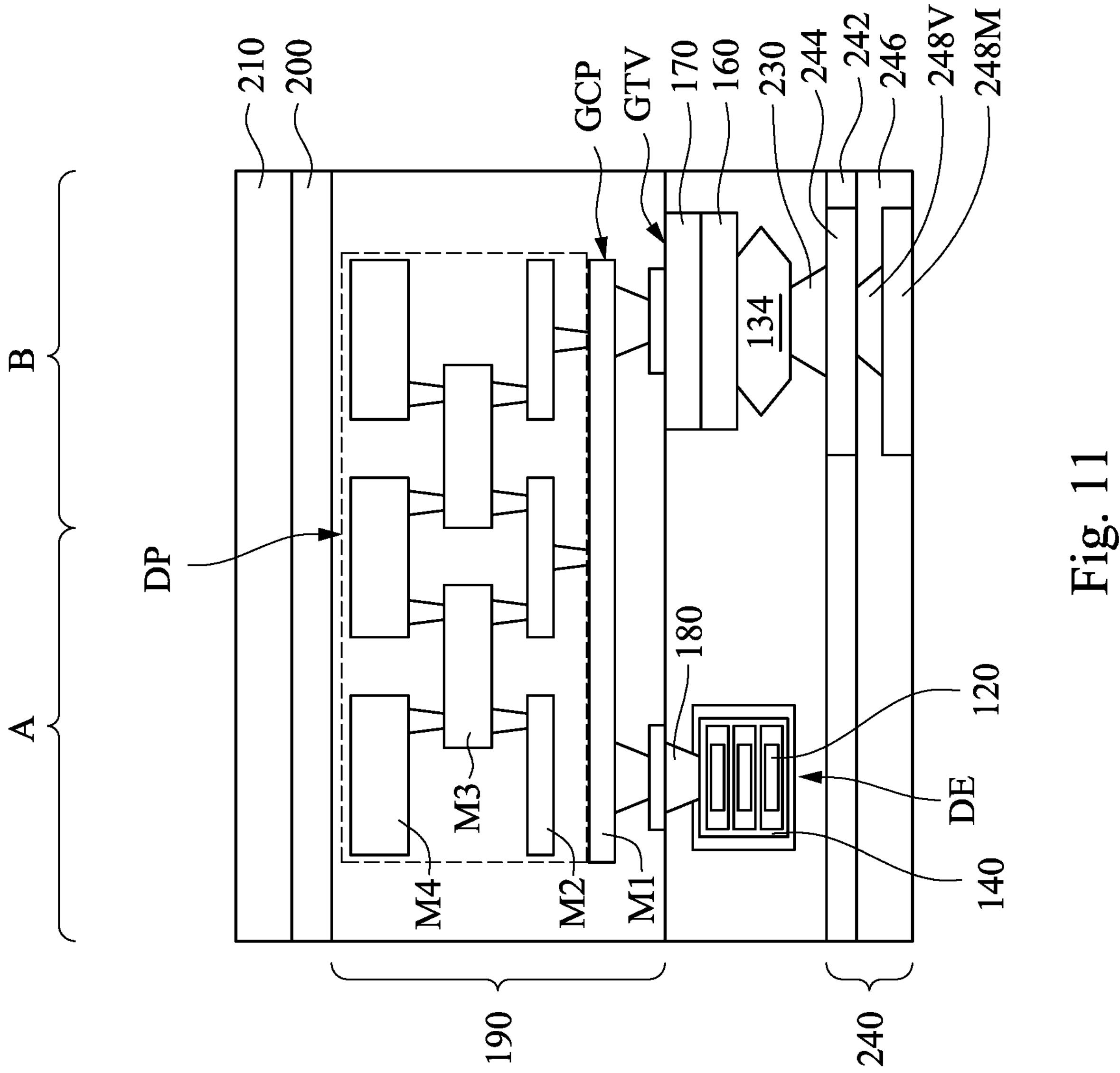

Reference is made to FIG. 11. A back-side metallization layer 248M and a back-side metallization via 248V are formed in the trench opening(s) T2 and the via opening/recess VO1. Formation of the back-side metallization layer 248M and the back-side metallization via 248V may include filling trench opening(s) T2 and the via opening/recess VO1 in the ILD layer 246 with a suitable conductive material. The conductive material may include TiN, TaN, Ti, Ta, W. Pt, copper, the like, or the combination thereof. A planarization process (e.g., chemical mechanical polish (CMP) process) may be performed to remove an excess portion of the conductive material external to the trench opening(s) T2, and remaining portions of the conductive material form the back-side metallization layer 248M and the back-side metallization via 248V. The back-side metallization layer 244 may include plural metal lines extend horizontally in the ILD layer 242. The back-side metallization via 248V extend vertically between the metal lines of the back-side metallization layer 244 in the ILD layer 242.

Figure 12:
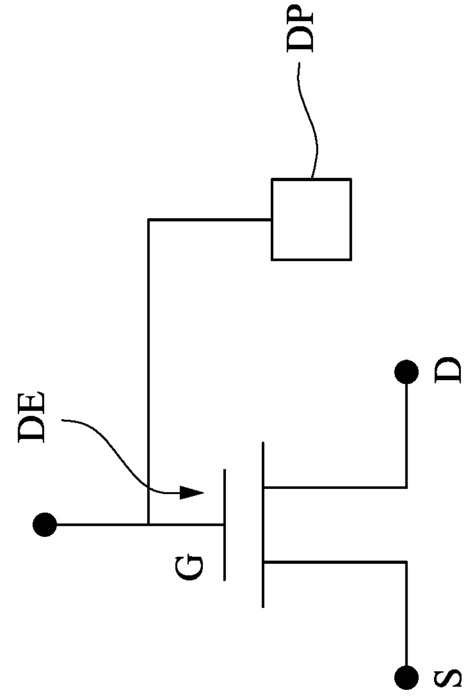
FIG. 12 is a circuit diagram of an integrated circuit device in accordance with some embodiments.

FIG. 12 is a circuit diagram of an integrated circuit device in accordance with some embodiments. The transistor DE has a gate terminal G corresponding to the gate structure 140 (referring to FIG. 11), a source terminal corresponding to one of the source/drain epitaxial structures 132, and a drain terminal corresponding to the other one of the source/drain epitaxial structures 132. In some embodiments of the present disclosure, the gate terminal G of the transistor DE is coupled to a dummy conductive pattern DP. The dummy conductive pattern DP can serve as a charge pool for receiving and relaxing charges induced plasma process, thereby preventing the charges induced in plasma process from reaching the high-k/metal gate structure, and protecting nanostructures wrapped by the high-k/metal gate structure from being damaged by the charges induced in plasma process.

Figure 13:
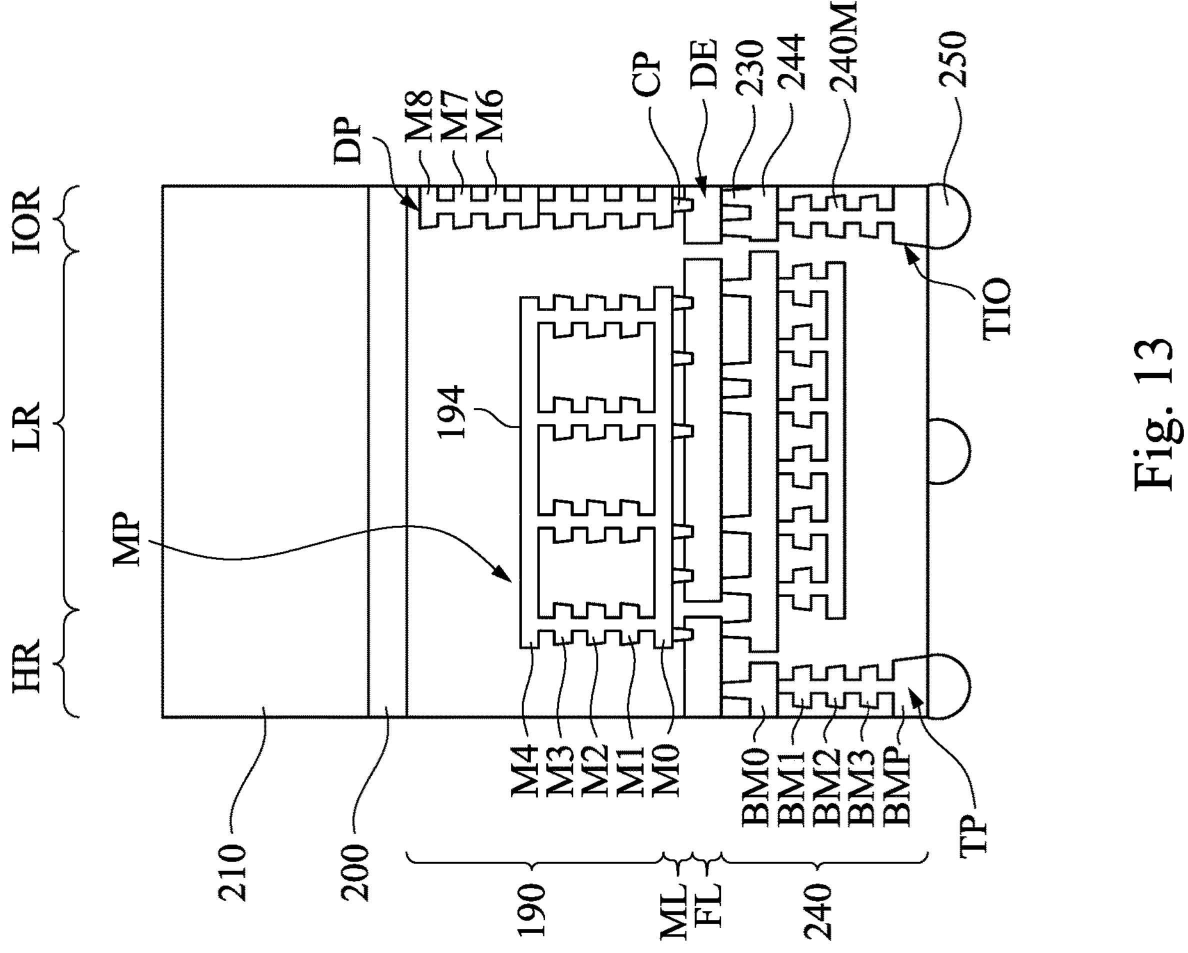
FIG. 13 is a schematic cross-sectional view of an integrated circuit device in accordance with some embodiments.

FIG. 13 is a schematic cross-sectional view of an integrated circuit device in accordance with some embodiments. The integrated circuit device may include a FEOL structure FL, a middle-end-of-line (MEOL) structure ML, a FMLI 190, and a BMLI 240. The FEOL structure includes the transistor DE, including the nanostructures 120, the gate structures 140, and the source/drain epitaxial structures 132, and the source/drain epitaxial structure 134 in FIGS. 2A and 2B. The MEOL structure ML includes the contact structures CP, which corresponds to the source/drain contact structures 160, source/drain vias 170, and gate contact via 180 in FIGS. 3A and 3B. The FMLI 190 has a metallization pattern 194. The metallization layers in the metallization pattern 194 are denoted as metallization layers M0-M8. The metallization pattern 194 has a dummy conductive pattern DP coupled to the gate structures 140 of the transistor DE, and a main conductive path pattern MP coupled to a source node of the source/drain epitaxial structures 132. The BMLI 240 has a metallization pattern 240M (including the back-side metallization layers 244, 248M and back-side metallization via 248V in FIG. 11). The back-side metallization layers in the metallization pattern 240M are denoted as back-side metallization layers BM0-BM3. The metallization pattern 240M can be coupled to the gate structures 140 of the transistor DE and a drain node of the source/drain epitaxial structures 132.

The integrated circuit device may include connectors 250 at the backside thereof. In some examples, the connectors 250 may be solder balls including a solder material in some embodiments. In some alternative embodiments, the connectors 250 may be metal pillars, bumps, micro bumps, the like, or the combination thereof. The connector 250 may include a conductive material such as solder, copper, aluminum, gold, nickel, silver, palladium, tin, the like, or a combination thereof. For example, the lowest metallization layer of the metallization pattern 240M may serve as metal cap pads BMP, and the solder balls 250 are disposed over the metal cap pads. The metal cap pads BMP (e.g., the lowest metallization layer of the metallization pattern 240M) may form input/output (I/O) terminals TIO, power terminal TP, or other terminals. The power terminal TP may receive powers from external devices. The I/O terminals may be capable of receiving from external devices and sending signals to external devices. The connector 250 bonds the metal cap layer (e.g., the I/O terminals TIO and/or the power terminal TP) to a conductive structure over another substrate.

The integrated circuit device may include a header region HR, where a power converter circuit is disposed, and the power from a power terminal can be converted by the power converter circuit according to various device in the device circuit and then transmitted to the various device. The integrated circuit device may include a logic region LR where a logic circuit is disposed. The integrated circuit device may include a I/O region IOR where a I/O circuit is disposed. The configuration of the dummy conductive pattern DP can be used in devices DE in the logic circuit in the logic region LR, in the I/O circuit in the I/O region IOR, and/or the circuit in the header region HR. Other details of the present embodiments are similar to those illustrated above, and not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by designing a dummy conductive pattern, a plasma-induced damage (PID) from back-side plasma process can be relaxed, thereby avoiding channel resistance degradation. Another advantage is that the dummy conductive pattern can be designed at the frontside of the integrated circuit device, spaces at backside of the integrated circuit device can be saved for drain routing and gate routing.

According to some embodiments of the present disclosure, an integrated circuit device includes a transistor, a dielectric layer, a first vertical connecting structure. The transistor includes a gate structure. The dielectric layer surrounds the transistor. The first vertical connecting structure extends through the dielectric layer. The gate contact via is over the gate structure. The front-side metallization pattern is over the transistor. The front-side metallization pattern includes a first conductive path and a dummy conductive pattern. The first conductive path connects the gate contact via to a top end of the first vertical connecting structure. The dummy conductive pattern is connected to the first conductive path. The back-side metallization layer is below the transistor, wherein the back-side metallization layer is connected with a bottom end of the first vertical connecting structure.

According to some embodiments of the present disclosure, an integrated circuit device includes a transistor, a front-side metallization pattern, a back-side metallization layer, and a vertical connecting structure. The transistor includes a gate structure. The front-side metallization pattern is over the transistor, wherein the front-side metallization pattern comprises: a conductive line electrically connected to the gate structure; a dummy conductive pattern comprising at least one dummy conductive line electrically coupled to the conductive line; and a main pattern isolated from the dummy conductive pattern of the front-side metallization pattern. The back-side metallization layer is below the transistor. The vertical connecting structure connects the conductive line to the back-side metallization layer.

According to some embodiments of the present disclosure, a method for manufacturing an integrated circuit device is provided. The method includes: forming a transistor and a doped epitaxial structure over a semiconductor substrate, wherein the transistor comprises a gate structure; forming a front-side contact over a front-side of the doped epitaxial structure; forming a front-side via over the front-side contact; forming a gate contact via over the transistor; forming a front-side metallization pattern over the front-side via and the gate contact via, wherein the front-side metallization pattern comprises: a first conductive path extending from the gate contact via to the front-side via; and a dummy conductive pattern connected to the first conductive path; forming a back-side contact over a back-side of the doped epitaxial structure; and forming a first back-side metallization layer on the back-side contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a transistor comprising a gate structure;
a dielectric layer surrounding the transistor;
a first vertical connecting structure extending through the dielectric layer;
a gate contact via over the gate structure;
a front-side metallization pattern over the transistor and the gate contact via, wherein the front-side metallization pattern comprises:
a first conductive path extending from the gate contact via to a top end of the first vertical connecting structure; and
a dummy conductive pattern connected to the first conductive path;
a back-side metallization layer below the transistor, wherein the back-side metallization layer is connected with a bottom end of the first vertical connecting structure; and
a second vertical connecting structure extending through the dielectric layer, wherein the front-side metallization pattern further comprises a second conductive path electrically connecting a source/drain epitaxial structure of the transistor to a top end of the second vertical connecting structure.

2. The integrated circuit device of claim 1, wherein a metal line of the dummy conductive pattern is higher than a metal line of the first conductive path.

3. The integrated circuit device of claim 1, wherein the dummy conductive pattern comprises:
a plurality of metal lines in a first front-side metallization layer of the front-side metallization pattern;
a plurality of metal lines in a second front-side metallization layer of the front-side metallization pattern over the first front-side metallization layer; and
a plurality of metallization vias connecting the metal lines in the first front-side metallization layer to the metal lines in the second front-side metallization layer.

4. The integrated circuit device of claim 1, wherein the front-side metallization pattern comprises a main conductive pattern electrically connected to another source/drain epitaxial structure of the transistor, and the dummy conductive pattern is spaced apart from the main conductive pattern.

5. The integrated circuit device of claim 4, wherein the dummy conductive pattern comprises a plurality of first metal lines in a front-side metallization layer of the front-side metallization pattern, and the main conductive pattern comprises a plurality of second metal lines in the front-side metallization layer of the front-side metallization pattern.

6. The integrated circuit device of claim 4, further comprising:
a dielectric structure surrounding the front-side metallization pattern, wherein the dummy conductive pattern is spaced apart from the main conductive pattern by a portion of the dielectric structure.

7. The integrated circuit device of claim 1, wherein the first vertical connecting structure comprises:
a doped epitaxial structure;
a front-side contact over a front-side of the doped epitaxial structure; and
a back-side contact over a back-side of the doped epitaxial structure.

8. The integrated circuit device of claim 1, wherein the second vertical connecting structure comprises an epitaxial structure.

9. The integrated circuit device of claim 8, wherein the second vertical connecting structure further comprises a backside contact and a front-side contact on opposite sides of the epitaxial structure.

10. The integrated circuit device of claim 9, wherein the second vertical connecting structure further comprises a via structure disposed over the front-side contact.

11. The integrated circuit device of claim 8, wherein the epitaxial structure of the second vertical connecting structure has a bottom level with a bottom of the source/drain epitaxial structure of the transistor.

12. The integrated circuit device of claim 8, wherein the epitaxial structure of the second vertical connecting structure is doped.

13. An integrated circuit device, comprising:
a transistor comprising a gate structure;
a front-side metallization pattern over the transistor, wherein the front-side metallization pattern comprises:
a conductive line electrically connected to the gate structure;
a dummy conductive pattern comprising a plurality of dummy conductive lines electrically coupled to the conductive line, and the dummy conductive lines are at different metallization layers of the front- side metallization pattern, wherein the dummy conductive pattern comprises a plurality of conductive vias connecting the dummy conductive lines at different metallization layers to each other; and
a main pattern isolated from the dummy conductive pattern of the front-side metallization pattern;
a back-side metallization layer below the transistor; and
a vertical connecting structure connecting the conductive line to the back-side metallization layer.

14. The integrated circuit device of claim 13, further comprising:
a dielectric structure surrounding the front-side metallization pattern, wherein the dielectric structure isolates the dummy conductive pattern of the front-side metallization pattern from the main pattern of the front-side metallization pattern.

15. The integrated circuit device of claim 13, wherein the dummy conductive pattern further comprises a conductive via connecting one of the dummy conductive lines to the conductive line, and the conductive via vertically overlaps the vertical connecting structure.

16. The integrated circuit device of claim 13, wherein the vertical connecting structure comprises:
a doped epitaxial structure;
a front-side contact over a front-side of the doped epitaxial structure; and
a back-side contact over a back-side of the doped epitaxial structure.

17. A method for manufacturing an integrated circuit device, comprising:
forming a transistor and a doped epitaxial structure over a semiconductor substrate, wherein the transistor comprises a gate structure;
forming a front-side contact over a front-side of the doped epitaxial structure;
forming a front-side via over the front-side contact;
forming a gate contact via over the transistor;

forming a front-side metallization pattern over the front-side via and the gate contact via, wherein the front-side metallization pattern comprises:

a first conductive path extending from the gate contact via to the front-side via; and a dummy conductive pattern connected to the first conductive path;

forming a back-side contact over a back-side of the doped epitaxial structure; and forming a first back-side metallization layer on the back-side contact.

18. The method of claim 17, wherein forming the first back-side metallization layer comprises:

depositing an interlayer dielectric layer on the back-side contact;

etching an opening in the interlayer dielectric layer to expose the back-side contact; and filling the opening with a conductive material.

19. The method of claim 18, wherein etching the opening in the interlayer dielectric layer comprises a plasma etching process.

20. The method of claim 17, further comprising:

forming a second back-side metallization layer on the first back-side metallization layer, wherein forming the second back-side metallization layer comprises:

depositing an interlayer dielectric layer on the first back-side metallization layer;

using a plasma etching process, etching an opening in the interlayer dielectric layer to expose a metal line of the first back-side metallization layer; and filling the opening with a conductive material.

* * * * *